US009562955B2

(12) United States Patent
Von Novak, III

(10) Patent No.: US 9,562,955 B2
(45) Date of Patent: Feb. 7, 2017

(54) METHODS AND APPARATUS FOR MAGNETIC FIELD STRENGTH MEASUREMENT

(71) Applicant: QUALCOMM Incorporated, San Diego, CA (US)

(72) Inventor: William Henry Von Novak, III, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 180 days.

(21) Appl. No.: 14/493,165

(22) Filed: Sep. 22, 2014

(65) Prior Publication Data

US 2015/0204949 A1   Jul. 23, 2015

Related U.S. Application Data

(60) Provisional application No. 61/929,258, filed on Jan. 20, 2014.

(51) Int. Cl.
  *G01R 33/02*   (2006.01)
  *H02J 7/02*   (2016.01)
  *H02J 5/00*   (2016.01)
(52) U.S. Cl.
  CPC ............ *G01R 33/02* (2013.01); *H02J 5/005* (2013.01); *H02J 7/025* (2013.01)
(58) Field of Classification Search
  CPC ........... G01R 33/02; H02J 5/005; H02J 7/025
  USPC ............................................. 324/258, 207.17
  See application file for complete search history.

(56) References Cited

U.S. PATENT DOCUMENTS

| | | | |
|---|---|---|---|
| 4,742,298 A * | 5/1988 | Ando | G01N 27/9046 324/220 |
| 5,149,980 A | 9/1992 | Ertel et al. | |
| 5,583,435 A * | 12/1996 | Takemoto | G07F 17/34 273/121 A |
| 5,729,008 A | 3/1998 | Blalock et al. | |
| 5,955,879 A * | 9/1999 | Durdle | A61B 5/1116 324/207.17 |
| 6,392,632 B1 | 5/2002 | Lee | |
| 6,433,780 B1 | 8/2002 | Gordon et al. | |
| 2003/0090424 A1* | 5/2003 | Brune | H01Q 1/04 343/741 |
| 2006/0119351 A1* | 6/2006 | James | G01D 5/204 324/207.17 |

(Continued)

*Primary Examiner* — Jay Patidar
(74) *Attorney, Agent, or Firm* — Knobbe Martens Olson & Bear LLP

(57) ABSTRACT

This disclosure provides methods and apparatus for wireless power field testing. An apparatus for sensing magnetic field strength of a wireless charging pad is provided. The apparatus includes a plurality of conductive loops each configured to sense a strength of a magnetic field passing through a respective one of the plurality of conductive loops. The apparatus includes at least one pair of terminals configured to be electrically connected to one or more of the plurality of conductive loops and configured to provide a voltage signal having a magnitude proportional to the strength of the magnetic field passing through the one or more of the plurality of conductive loops. In some implementations, the apparatus further includes a multiplexer circuit configured to individually electrically connect each of at least a subset of the plurality of conductive loops to the at least one pair of terminals.

20 Claims, 8 Drawing Sheets

(56) References Cited

U.S. PATENT DOCUMENTS

2007/0024277 A1* 2/2007 Cech .................. G01D 5/202
324/239
2014/0111019 A1* 4/2014 Roy .................... G01V 3/081
307/104

* cited by examiner

METHODS AND APPARATUS FOR MAGNETIC FIELD STRENGTH MEASUREMENT

CLAIM OF PRIORITY UNDER 35 U.S.C. §119

The present application for patent claims priority to Provisional Application No. 61/929,258 entitled "METHODS AND APPARATUS FOR WIRELESS POWER FIELD TESTING" FILED Jan. 20, 2014, AND ASSIGNED TO THE ASSIGNEE HEREOF. PROVISIONAL APPLICATION NO. 61/929,258 IS HEREBY EXPRESSLY INCORPORATED BY REFERENCE HEREIN.

FIELD

The present disclosure relates generally to wireless power transfer, and more specifically to methods and apparatus for wireless power field testing.

BACKGROUND

When designing wireless power systems, there are several important tasks to be performed during design and testing including measurement of the total magnetic field density (H) and/or magnetic flux density (B), measurement of field evenness in open coil cases, and monitoring magnetic flux density once a chargeable device has been placed. Testing of the magnetic field density or magnetic flux density has traditionally been performed by moving a loop around the transmitter pad. However, it is difficult to move and place a loop accurately over tens or hundreds of locations on the pad to be measured. It is also difficult to insert a coil under an operating device without disturbing it. As such, there is a need for methods and apparatus for wireless power field testing.

SUMMARY

Various implementations of methods and devices within the scope of the appended claims each have several aspects, no single one of which is solely responsible for the desirable attributes described herein. Without limiting the scope of the appended claims, some prominent features are described herein.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

One aspect of the disclosure provides an apparatus for sensing magnetic field strength of a wireless charging pad. The apparatus comprises a plurality of conductive loops, each configured to sense a strength of a magnetic field passing through a respective one of the plurality of conductive loops. The apparatus further comprises at least one pair of terminals configured to be electrically connected to one or more of the plurality of conductive loops and configured to provide a voltage signal having a magnitude proportional to the strength of the magnetic field passing through the one or more of the plurality of conductive loops.

Another aspect of the disclosure provides an implementation of a method for sensing magnetic field strength of a wireless charging pad. The method comprises sensing a voltage signal having a magnitude proportional to a strength of a magnetic field passing through each of at least a subset of a plurality of conductive loops. The method further comprises determining the strength of the magnetic field passing through each of at least a subset of the plurality of conductive loops based at least in part on the voltage signal.

Yet another aspect of the disclosure provides apparatus for sensing magnetic field strength of a wireless charging pad. The apparatus comprises a plurality of means for sensing a strength of a magnetic field passing through each of a plurality of predefined spatial areas. The apparatus further comprises means for providing a voltage signal having a magnitude proportional to the strength of the magnetic field passing through one or more of the plurality of means for sensing. The means for providing are configured to be electrically connected to one or more of the plurality of means for sensing.

Figure 1:
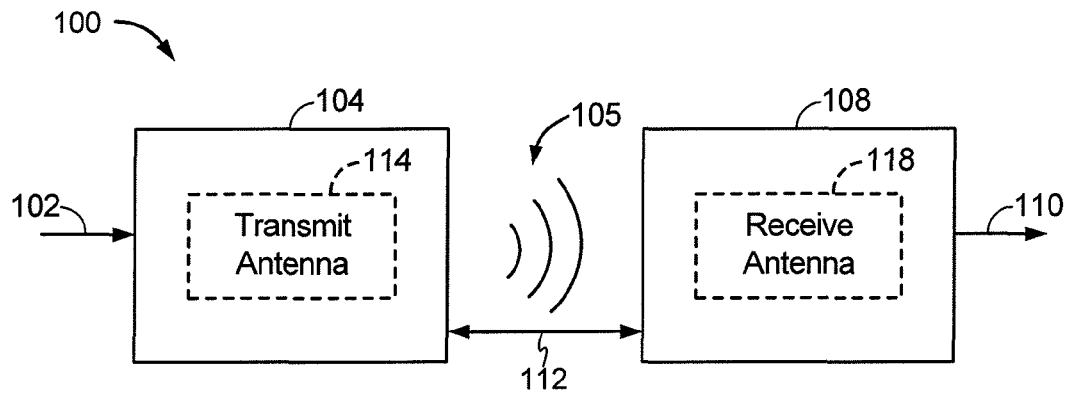
FIG. 1 is a functional block diagram of a wireless power transfer system, in accordance with one exemplary implementation.

The various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The detailed description set forth below in connection with the appended drawings is intended as a description of exemplary implementations and is not intended to represent the only implementations in which the invention may be practiced. The term "exemplary" used throughout this description means "serving as an example, instance, or illustration," and should not necessarily be construed as preferred or advantageous over other exemplary implementations. The detailed description includes specific details for the purpose of providing a thorough understanding of the exemplary implementations. In some instances, some devices are shown in block diagram form.

Wirelessly transferring power may refer to transferring any form of energy associated with electric fields, magnetic fields, electromagnetic fields, or otherwise from a transmitter to a receiver without the use of physical electrical conductors (e.g., power may be transferred through free space). The power output into a wireless field (e.g., a magnetic field) may be received, captured by, or coupled by a "receiving coil" to achieve power transfer.

FIG. 1 is a functional block diagram of a wireless power transfer system 100, in accordance with one exemplary implementation. An input power 102 may be provided to a transmitter 104 from a power source (not shown) to generate a wireless (e.g., magnetic or electromagnetic) field 105 for performing energy transfer. A receiver 108 may couple to the wireless field 105 and generate an output power 110 for storing or consumption by a device (not shown) coupled to the output power 110. Both the transmitter 104 and the receiver 108 are separated by a distance 112.

In one exemplary implementation, the transmitter 104 and the receiver 108 are configured according to a mutual resonant relationship. When the resonant frequency of the receiver 108 and the resonant frequency of the transmitter 104 are substantially the same or very close, transmission losses between the transmitter 104 and the receiver 108 are minimal. As such, wireless power transfer may be provided over a larger distance in contrast to purely inductive solutions that may require large antenna coils which are very close (e.g., sometimes within millimeters). Resonant inductive coupling techniques may thus allow for improved efficiency and power transfer over various distances and with a variety of inductive coil configurations.

The receiver 108 may receive power when the receiver 108 is located in the wireless field 105 produced by the transmitter 104. The wireless field 105 corresponds to a region where energy output by the transmitter 104 may be captured by the receiver 108. The wireless field 105 may correspond to the "near-field" of the transmitter 104 as will be further described below. The transmitter 104 may include a transmit antenna or coil 114 for transmitting energy to the receiver 108. The receiver 108 may include a receive antenna or coil 118 for receiving or capturing energy transmitted from the transmitter 104. The near-field may correspond to a region in which there are strong reactive fields resulting from the currents and charges in the transmit coil 114 that minimally radiate power away from the transmit coil 114. The near-field may correspond to a region that is within about one wavelength (or a fraction thereof) of the transmit coil 114.

As described above, efficient energy transfer may occur by coupling a large portion of the energy in the wireless field 105 to the receive coil 118 rather than propagating most of the energy in an electromagnetic wave to the far field. When positioned within the wireless field 105, a "coupling mode" may be developed between the transmit coil 114 and the receive coil 118. The area around the transmit antenna 114 and the receive antenna 118 where this coupling may occur is referred to herein as a coupling-mode region.

Figure 2:
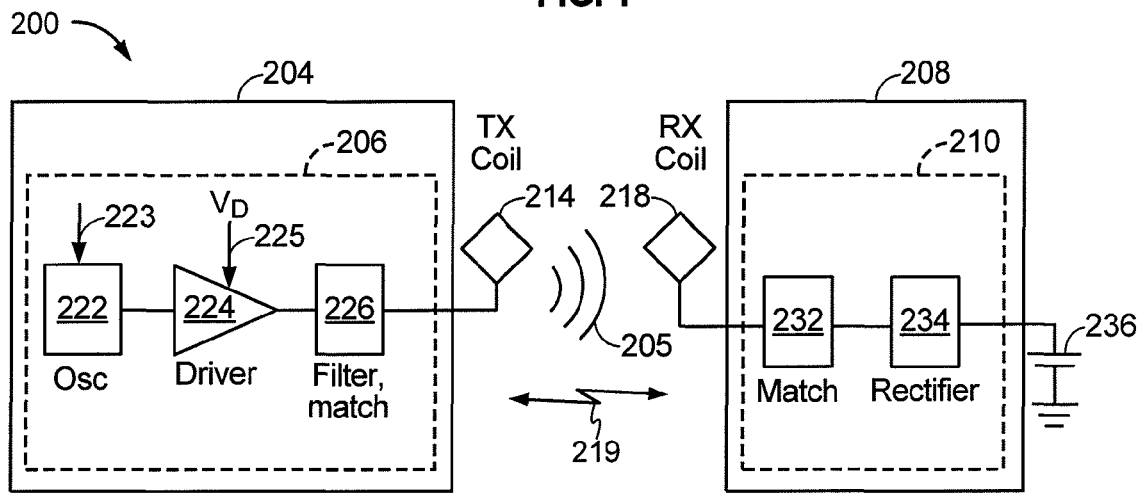
FIG. 2 is a functional block diagram of a wireless power transfer system, in accordance with another exemplary implementation.

FIG. 2 is a functional block diagram of a wireless power transfer system 200, in accordance with another exemplary implementation. The system 200 includes a transmitter 204 and a receiver 208. The transmitter 204 may include a transmit circuitry 206 that may include an oscillator 222, a driver circuit 224, and a filter and matching circuit 226. The oscillator 222 may be configured to generate a signal at a desired frequency that may be adjusted in response to a frequency control signal 223. The oscillator 222 may provide the oscillator signal to the driver circuit 224. The driver circuit 224 may be configured to drive the transmit antenna 214 at, for example, a resonant frequency of the transmit antenna 214 based on an input voltage signal ($V_D$) 225. The driver circuit 224 may be a switching amplifier configured to receive a square wave from the oscillator 222 and output a sine wave. For example, the driver circuit 224 may be a class E amplifier.

The filter and matching circuit 226 may filter out harmonics or other unwanted frequencies and match the impedance of the transmitter 204 to the transmit antenna 214. As a result of driving the transmit antenna 214, the transmit antenna 214 may generate a wireless field 205 to wirelessly output power at a level sufficient for charging a battery 236 of an electric vehicle, for example.

The receiver 208 may include a receive circuitry 210 that may include a matching circuit 232 and a rectifier circuit 234. The matching circuit 232 may match the impedance of the receive circuitry 210 to the receive antenna 218. The rectifier circuit 234 may generate a direct current (DC) power output from an alternate current (AC) power input to charge the battery 236, as shown in FIG. 2. The receiver 208 and the transmitter 204 may additionally communicate on a separate communication channel 219 (e.g., Bluetooth, Zigbee, cellular, etc). The receiver 208 and the transmitter 204 may alternatively communicate via in-band signaling using characteristics of the wireless field 205.

The receiver 208 may be configured to determine whether an amount of power transmitted by the transmitter 204 and received by the receiver 208 is appropriate for charging the battery 236.

Figure 3:
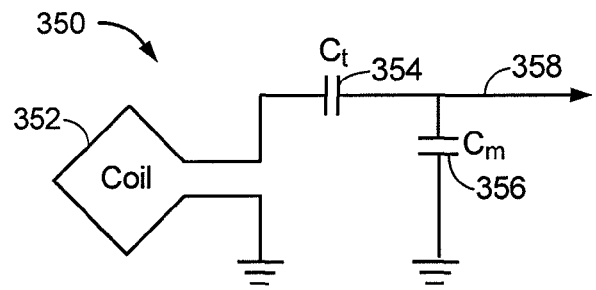
FIG. 3 is a schematic diagram of a portion of transmit circuitry or receive circuitry of FIG. 2 including a transmit or receive antenna, in accordance with exemplary implementations.

FIG. 3 is a schematic diagram of a portion of the transmit circuitry 206 or the receive circuitry 210 of FIG. 2 including a transmit or receive antenna, in accordance with exemplary implementations. As illustrated in FIG. 3, a transmit or receive circuitry 350 may include an antenna 352. The antenna 352 may also be referred to or be configured as a "loop" antenna 352. The antenna 352 may also be referred to herein or be configured as a "magnetic" antenna or an induction coil. The term "antenna" generally refers to a component that may wirelessly output or receive energy for coupling to another "antenna." The antenna may also be referred to as a coil of a type that is configured to wirelessly output or receive power. As used herein, the antenna 352 is an example of a "power transfer component" of a type that is configured to wirelessly output and/or receive power.

The antenna 352 may include an air core or a physical core such as a ferrite core (not shown). Air core loop antennas may be more tolerable to extraneous physical devices placed in the vicinity of the core. Furthermore, an air core loop antenna 352 allows the placement of other components within the core area. In addition, an air core loop may more readily enable placement of the receive antenna 218 (FIG. 2) within a plane of the transmit antenna 214 (FIG. 2) where the coupled-mode region of the transmit antenna 214 may be more powerful.

As stated, efficient transfer of energy between the transmitter 104/204 and the receiver 108/208 may occur during matched or nearly matched resonance between the transmitter 104/204 and the receiver 108/208. However, even when resonance between the transmitter 104/204 and receiver 108/208 are not matched, energy may be transferred, although the efficiency may be affected. For example, the efficiency may be less when resonance is not matched. Transfer of energy occurs by coupling energy from the wireless field 105/205 of the transmit coil 114/214 to the receive coil 118/218, residing in the vicinity of the wireless field 105/205, rather than propagating the energy from the transmit coil 114/214 into free space.

The resonant frequency of the loop or magnetic antennas is based on the inductance and capacitance. Inductance may be simply the inductance created by the antenna 352, whereas, capacitance may be added to the antenna's inductance to create a resonant structure at a desired resonant frequency. As a non-limiting example, a capacitor 354 and a capacitor 356 may be added to the transmit or receive circuitry 350 to create a resonant circuit that selects a signal 358 at a resonant frequency. Accordingly, for larger diameter antennas, the size of capacitance needed to sustain resonance may decrease as the diameter or inductance of the loop increases.

Furthermore, as the diameter of the antenna increases, the efficient energy transfer area of the near-field may increase. Other resonant circuits formed using other components are also possible. As another non-limiting example, a capacitor may be placed in parallel between the two terminals of the circuitry 350. For transmit antennas, the signal 358, with a frequency that substantially corresponds to the resonant frequency of the antenna 352, may be an input to the antenna 352.

Referring to FIGS. 1 and 2, the transmitter 104/204 may output a time varying magnetic (or electromagnetic) field with a frequency corresponding to the resonant frequency of the transmit coil 114/214. When the receiver 108/208 is within the wireless field 105/205, the time varying magnetic (or electromagnetic) field may induce a current in the receive coil 118/218. As described above, if the receive coil 118/218 is configured to resonate at the frequency of the transmit coil 114/214, energy may be efficiently transferred. The AC signal induced in the receive coil 118/218 may be rectified as described above to produce a DC signal that may be provided to charge or to power a load.

Figure 4:
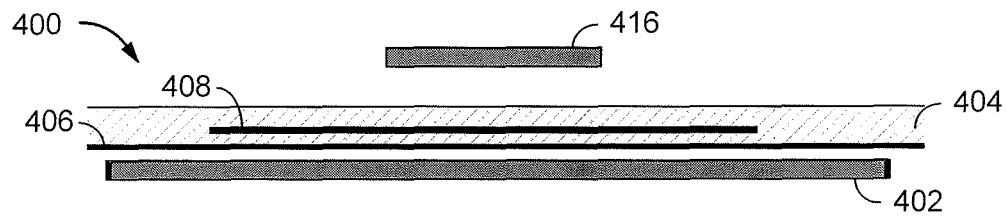
FIG. 4 is a diagram illustrating a side view of an apparatus for wireless power field testing disposed in, on, or over a base pad, in accordance with an exemplary implementation.

FIG. 4 is a diagram illustrating a side view of an apparatus 400 for wireless power field testing disposed in, on, or over a base pad 402, in accordance with an exemplary implementation. The base pad 402 may further include a transmit coil 214 (FIG. 2) and associated circuitry as previously described in connection with FIGS. 1-3. The apparatus 400 may include an enclosure 404 (e.g., a plastic enclosure) and may be configured to hold a planar, or non-overlapping sense loop array 406. In some implementations, where overlapping loops are utilized, the apparatus 400 may additionally include a sense loop array 408 that overlaps sense loop array 406. The diagram additionally shows a receiver coil 416 which may or may not be present during wireless power field testing.

During wireless charging, the total magnetic field (i.e., the H-field) determines the AC voltage induced in the receiver (e.g., the receiver coil 416) in accordance with Faraday's Law of Induction. In free space, the H-field equals the magnetic flux (i.e., the B-field). Accordingly, when used without any additional magnetic materials (or receiver 416) present, the apparatus 400 may allow for determination of the H-field present in the vicinity of the apparatus 400. By contrast, in the presence of a high permeability magnetic material the B-field is greater than the H-field. Accordingly, where any magnetic material is present on or over the base pad 402, the apparatus 400 may allow for determination of the B-field present. Likewise, if a receiving device having a receive coil present, the apparatus 400 may allow for determination of the actual B-field present in the vicinity of the receiving device. Designers of wireless power chargers may find it desirable to carefully control the H-field to control the voltage induced at the receiver. In addition, in many systems it is important to have a relatively even H-field over the transmitter (e.g., the base pad 402) because it is easier to equalize voltages across several devices placed on the same transmitter coil or base pad in the presence of even H-fields. However, once a power receiving device has been placed on a transmitting coil, the H-field is distorted by any metal or magnetic material within the device and/or by the resonance of the receiving coil. Thus, an apparatus and/or method by which the H-field may be measured over all or a portion of the area of a transmit coil may be desirable. As long as the area of the loop or coil is known, the H-field passing through the loop or coil may be calculated by observing, sensing or measuring the voltage and frequency of a signal induced in the loop or coil utilizing conductive loops or coils disposed in, on or over the transmit coil or base pad.

In some implementations, a large number of inductance sensing coils or loops may be integrated into a flat instrument or apparatus. Exemplary arrangements of such coils or loops are described in more detail in connection with FIGS. 5-7 below.

Figure 5:
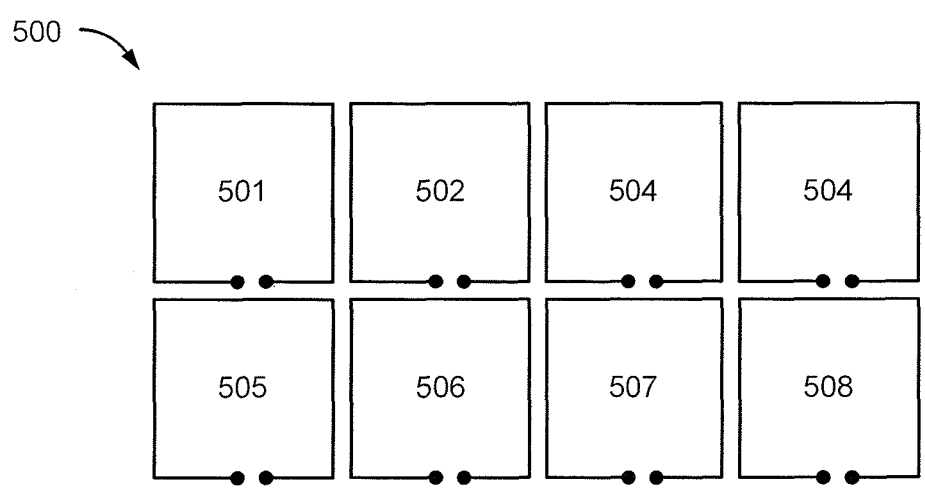
FIG. 5 is a diagram illustrating a loop array for wireless power field testing, in accordance with an exemplary implementation.

FIG. 5 is a diagram illustrating a loop array for wireless power field testing, in accordance with an exemplary implementation. As shown in FIG. 5, a loop array 500 may include a plurality of sense loops 501-508. In general, a sense loop 501 may be a multi-turn loop or coil of electrically conductive wire. Although 8 sense loops are show in FIG. 5, the present application is not so limited and may include any number of sense loops arranged in an array of any number of rows and columns, according to a particular application. Each of loops 501-508 in the sense loop array 500 may be electrically connected to a detection circuit by a lead line (not shown, see FIG. 8).

The loop array 500 may completely cover the area of a transmitter for which measurement of the H-field is desired. As described above, by measuring the voltage induced in each of the loops 501-508 a determination of the H-field intersecting each of the loops 501-508 may be made. Such induced voltages may accurately simulate a voltage induced in a free space open circuit series-tuned receiver having a loop or coil of similar size. In the alternative, by summing each of these voltages, a determination of the total H-field intersecting all of the loops 501-508 is possible. Accordingly, in at least some implementations, each of the loops 501-508 may be electrically separate from one another.

As shown in FIG. 5, the sense loops 501-508 may not overlap one another. If the sense loops 501-508 do not overlap one another, any area encompassed by any one of the sense loops 501-508 will not also be encompassed by any other sense loop of the sense loops 501-508. Such a non-overlapping structure may be advantageous for several reasons. A PCB containing the loop array may have a simpler design and a lower cost since fewer layers may be required. In addition, since the loops do not overlap one another the loops may be smaller than in implementations where the loops overlap. Furthermore, a non-overlapping sense loop design may offer greater flexibility for different board arrangements because the PCB may be divided into several subsections and arranged in accordance with a particular application.

The loops 501-508 may have any suitable dimension or predefined area according to the particular application. For example, in some implementations, each of the sense loops 501-508 may have a square or rectangular shape. In some other implementations, each of the sense loops 501-508 may have a circular, a hexagonal, or a triangular shape. For example, densely packed hexagonal loops may provide improved resolution with a non-overlapping structure requiring a lower number of copper layers when implemented in a printed circuit board.

Figure 6:
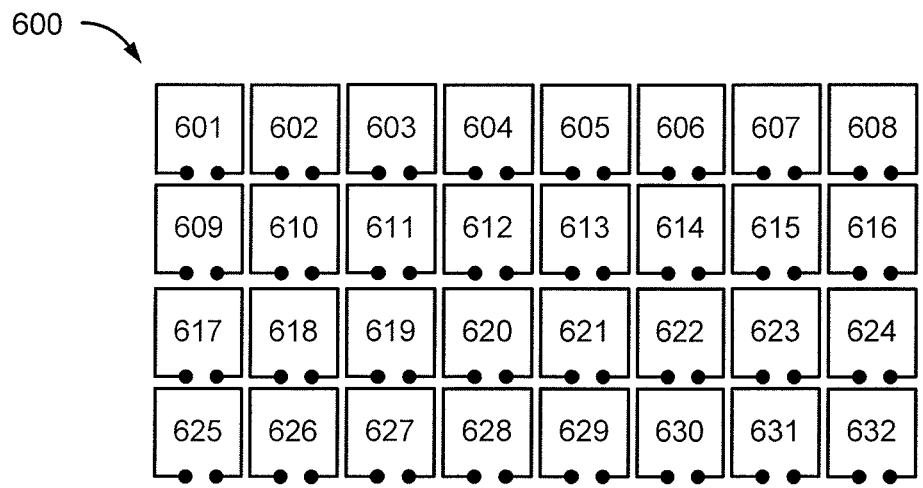
FIG. 6 is a diagram illustrating another loop array for wireless power field testing having smaller loops than the loops shown in FIG. 5, in accordance with an exemplary implementation.

FIG. 6 is a diagram illustrating another loop array for wireless power field testing having smaller loops than the loops shown in FIG. 5, in accordance with an exemplary implementation. As shown in FIG. 6, a loop array 600 may include a plurality of sense loops 601-632. The loop array 600 may have similar dimensions to the loop array 500 shown in FIG. 5, however, loop array 600 may have a higher spatial resolution than loop array 500 due to the increased number of loops, each encompassing a smaller area. Although 32 sense loops are shown in the loop array 600 (e.g., the loop array 600 is a 4×8 loop array), the present application is not so limited and may include any number of sense loops arranged in an array of any number of rows and columns, according to a particular application. The loops 601-632 may also have any suitable dimension according to the particular application. Each of loops 601-632 may be electrically connected to a detection circuit by a lead line (not shown, see FIG. 8). The loop array 600 may completely cover the area of a transmitter for which measurement of the H-field is desired.

As previously described in connection with FIG. 5, by measuring the voltage induced in each of the loops 601-632 a determination of the H-field intersecting each of the loops 601-632 may be made. This allows a higher resolution mapping of the H-fields, which may correspond to voltages induced in receive devices having receiving coils of a similar size to the size of the loops 601-632. Because the loops 601-632 each encompass a smaller area than the loops 501-508 of FIG. 5, the loops 601-632 may additionally allow for finer determination of H-field evenness. By summing each of these voltages, a determination of the total H-field intersecting all loops 601-632 is also possible. Accordingly, in at least some implementations, each of the loops 601-632 may be electrically separate from one another.

Figure 7:
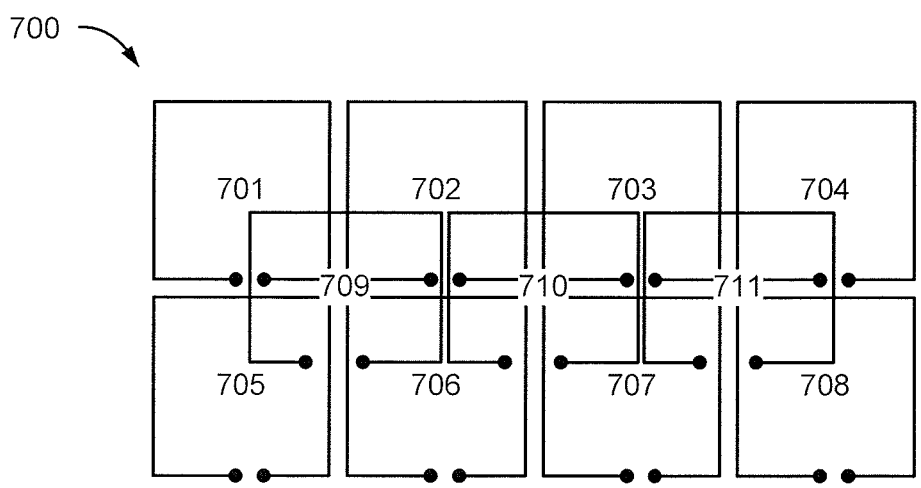
FIG. 7 is a diagram illustrating yet another loop array for wireless power field testing having overlapping loops, in accordance with an exemplary implementation.

FIG. 7 is a diagram illustrating yet another loop array for wireless power field testing having overlapping loops, in accordance with an exemplary implementation. As shown in FIG. 7, the loop array 700 includes a plurality of sense loops 701-708 which may be substantially the same as or similar to the sense loops 501-508 shown in FIG. 5. The loop array 700 may additionally include sense loops 709-711, which overlap the sense loops 701-708. Because the sense loops 709-711 overlap the sense loops 701-708, higher spatial resolution may be achieved than with the arrangement shown in FIG. 5 without reducing the size of the loops, as previously described in connection with FIG. 6. Although 11 sense loops are show in FIG. 7, the present application is not so limited and may include any number of sense loops arranged in an array of any number of overlapping rows and columns, according to a particular application. The loops 701-711 may have any suitable dimension according to the particular application. It may be desirable that a thickness of the loop array 700 be as thin as possible or practical. In addition, loop array 700 may completely cover the area of a transmitter for which measurement of the H-field is desired. As previously described in connection with FIGS. 5 and 6, by measuring the voltage induced in each of the loops 701-711 a determination of the H-field intersecting each of the loops 701-711 may be made.

Because at least a first portion of the loops 701-711 overlap a second portion of the loops 701-711, voltages induced in each of the loops 701-711 may be measured and processed to extract theoretical voltages, and by extension theoretical H-fields, that would be induced in smaller coils encompassing areas substantially equivalent to the areas of overlap of any two of the loops 701-711. For example, the voltage contributions of one or more overlapping loops may be subtracted from a sensed voltage of one or more other loops in order to achieve a higher effective resolution than would be possible with non-overlapping loops of similar size. Each of the loops 701-711 may be electrically separate from one another. In other words, the loops 701-711 may not be electrically connected to one another.

In addition to measuring voltage, phase may be measured in one or more implementations if the original phase-accurate signal (e.g., an oscillator signal that drives the wireless power transmitting system) is provided to the tester. In such a case, both H-field strength and phase difference may be measured by sufficiently accurate test equipment. Knowledge of phase may be useful to testers who wish to understand how a given power receiver changes the impedance of the system as a whole. Such knowledge of the phase of the voltage induced by the H-field may be useful to designers of multiple coil transmitter systems where different coils or loops are fed by different phases.

Figure 8:
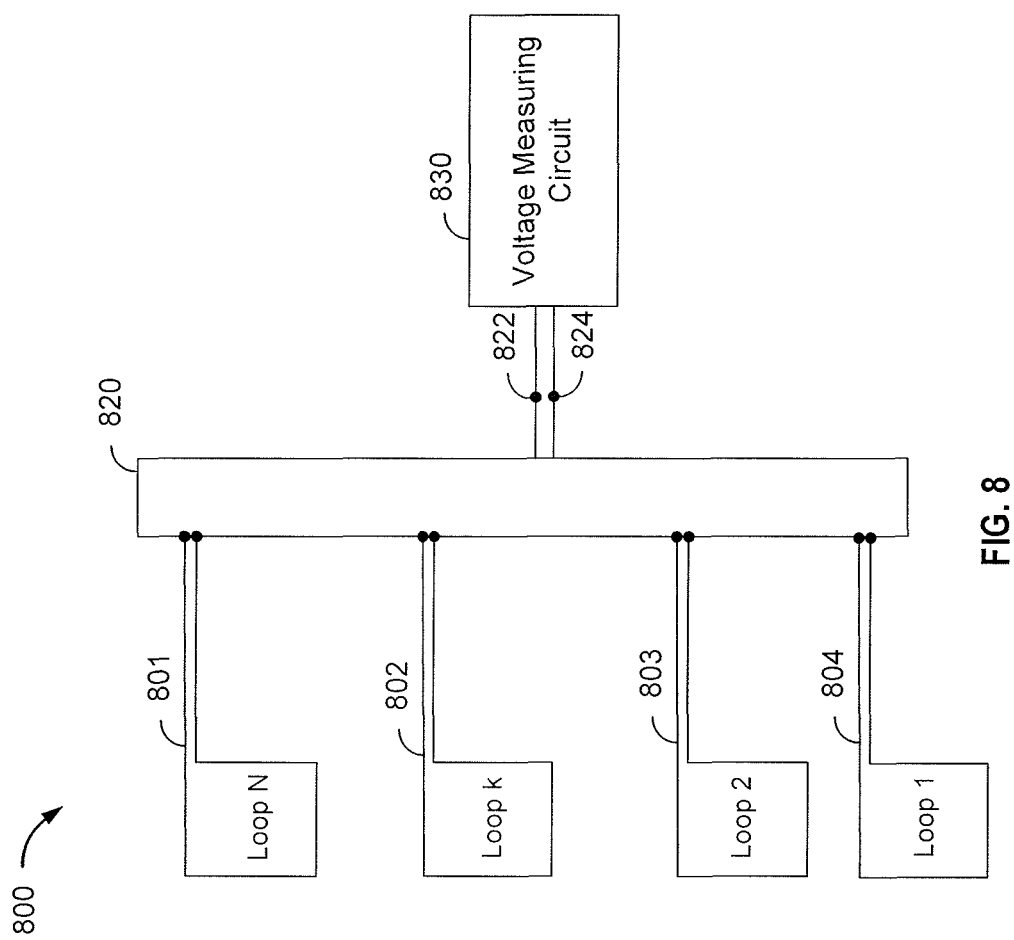
FIG. 8 is a functional block diagram of an exemplary circuit configured to measure a voltage induced in one or more loops in a loop array as shown in any of FIGS. 5-7.

FIG. 8 is a functional block diagram of an exemplary circuit configured to measure a voltage induced in one or more loops in a loop array as shown in any of FIGS. 5-7. As shown in FIG. 8, an apparatus 800 may include several sense loops 801, 802, 803, and 804 (hereinafter the sense loops 801-804). Although only four sense loops are shown, any number of sense loops may be utilized, in accordance with a particular application. The sense loops 801-804 may form at least a portion of an array of densely packed wire loops that cover an area within which a wireless power field may be tested. Accordingly, the sense loops 801-804 may correspond to sense loops in one or more of the sense loop array 500 of FIG. 5, the sense loop array 600 of FIG. 6, or the sense loop array 700 of FIG. 7.

As further shown in FIG. 8, terminals of each of the loops 801-804 (e.g., the unmarked dots) may be run to more convenient locations in the apparatus 800, via a pair of conductors. These terminals may be proximate to a respective loop or may be run to a more convenient location, such as an edge of the apparatus 800. In this way, the terminals may be presented to the test operator for measurement. It is desirable that the conductors in a pair be as close as possible to one another to reduce unwanted H-field pickup. Alternatively, a twisted pair of wires or conductors may be used to reduce H-field pickup. In either case, the additional shunt capacitance of the conductors should be taken into account to ensure a resonant condition is not created. The apparatus 800 includes a multiplexing circuit 820 (e.g., a multiplexer) that is configured to selectively couple each of the sense loops 801-804 to a voltage measuring circuit 830 via a pair of terminals 822 and 824 (e.g., a multiplexer port). In one implementation, the voltage measuring circuit 830 may comprise a hardware processor. The voltage measuring circuit 830 may alternatively comprise a digital multimeter, an oscilloscope, or any other appropriate circuit configured to measure an AC voltage at a frequency of operation of a transmitter under testing. A voltage impressed across the pair of terminals 822 and 824 may be sequentially and periodically measured by the voltage measuring circuit 830 for each loop 801-804 selected by the multiplexer 820. In this way, a the voltage measuring circuit 830 may measure the voltage induced in each of the loops 801-804 in an automated fashion as the multiplexing circuit 820 selects each of the loops 801-804 either simultaneously or sequentially. Accordingly, data may be presented in real time to allow a tester to observe the change in magnetic fields when the array of loops (e.g., the array 500, 600 or 700 of FIGS. 5-7, respectively) is moved or when a power receiving device (e.g., the receiver coil 416 of FIG. 4) is present in the vicinity of the apparatus (e.g., the apparatus 400 of FIG. 4 or the apparatus 800 of FIG. 8). As previously described, sensed H-fields from multiple loops may be summed to determine a total or aggregated H-field in real-time. In some implementations, one or more alarms may be triggered when measured H-fields are detected outside of a safe range, for example, when detected H-fields are strong enough to potentially damage a power receiver.

Figure 9:
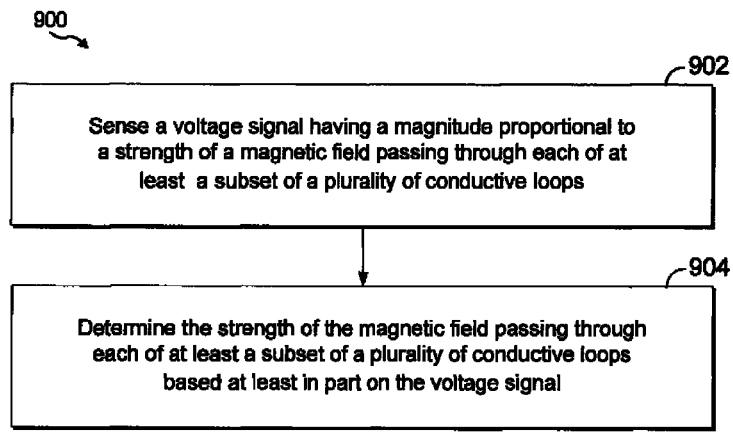
FIG. 9 is a flowchart of an exemplary method for wireless power field testing, in accordance with an exemplary implementation.

FIG. 9 is a flowchart of an exemplary method 900 for wireless power field testing, in accordance with an exemplary implementation. The steps or actions described in FIG. 9 may be implemented in, or carried out by, either of the circuits and/or devices shown in any of FIGS. 4-8. Block 902 may include sensing a voltage signal having a magnitude proportional to a strength of a magnetic field passing through each of at least a subset of a plurality of conductive loops. In one implementation, such sensing may be performed by one or more of the plurality of conductive loops as shown in any of FIGS. 5-7 and or by the voltage measuring circuit 830 of FIG. 8. For example, an AC voltage proportional to the total magnetic field passing through the area encompassed by a particular conductive loop will be induced across the terminals of that particular conductive loop. The multiplexer circuit 820 may then forward the induced AC voltage to the voltage measuring circuit 830. In some implementations, the multiplexer circuit 820 may forward an induced AC voltage from one or more of the loops 801-804 to the measuring circuit 830 and simultaneously forward an induced AC voltage from one or more other of the loops 801-804 to another measuring circuit (not shown in FIG. 8). Block 904 may include determining the strength of the magnetic field passing through each of at least a subset of a plurality of conductive loops based at least in part on the voltage signal. For example, since the AC voltage induced across the terminals of the particular conductive loop are proportional to the magnetic field passing through the area encompassed by a particular conductive loop, measurement of the induced voltage may be utilized to calculate or determine the strength of the magnetic field.

Figure 10:
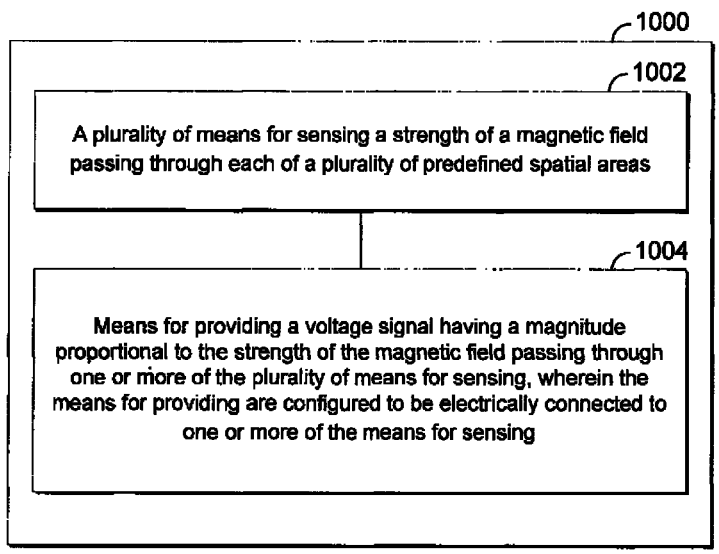
FIG. 10 is a functional block diagram of an apparatus for wireless power field testing, in accordance with an exemplary implementation.

FIG. 10 is a functional block diagram of an apparatus for wireless power field testing, in accordance with an exemplary implementation. Those skilled in the art will appreciate that an apparatus for wireless power field testing may have more components than the simplified apparatus 1000 shown in FIG. 10. The apparatus 1000 shown includes only those components useful for describing some prominent features of implementations within the scope of the claims.

The apparatus 1000 includes a plurality of means 1002 for sensing a strength of a magnetic field passing through each of a plurality of predefined spatial areas. In an implementation, the means 1002 can be configured to perform one or more of the functions described above with respect to blocks 902 and/or 904 of FIG. 9. In various implementations, the plurality of means 1002 can be implemented by one or more of the conductive loop arrays shown in any of FIGS. 5-7.

The apparatus 1000 further includes means 1004 for providing a voltage signal having a magnitude proportional to the strength of the magnetic field passing through one or more of the plurality of means for sensing, wherein the means 1004 for providing are configured to be electrically connected to one or more of the plurality of means 1002 for sensing. In an implementation, the means 1004 can be configured to perform one or more of the functions described above with respect to blocks 904 and/or 906. In various implementations, the means 1004 can be implemented by one or more of the loops 801-804, the multiplexer circuit 820, or the voltage measuring circuit 830 of FIG. 8, for example.

In some implementations, it may not be possible or practical to place a flat sensor pad on a wireless power transmitter due to shape or size constraints of the wireless power transmitter or the flat sensor pad. In such implementations, it may be desirable to have an instrument or apparatus (e.g., the apparatuses 1100 and 1200 of FIGS. 11 and 12, respectively) that includes one or more sense coils and that may be moved around the wireless power transmitter for testing the wireless power field.

Figure 11:
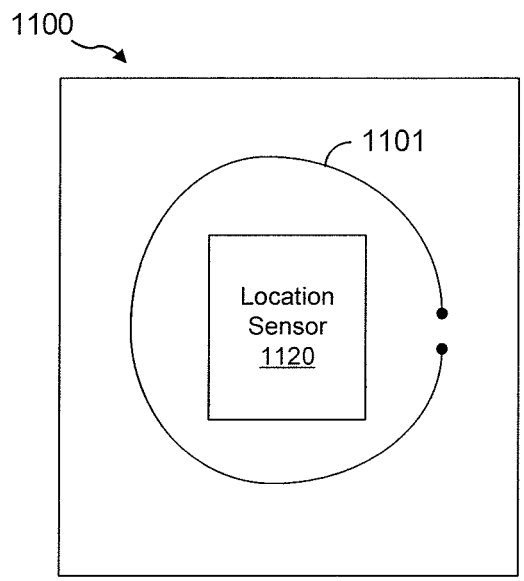
FIG. 11 is a diagram illustrating a bottom view of an apparatus for wireless power field testing of a base pad, in accordance with an exemplary implementation.

FIG. 11 is a diagram illustrating a bottom view of an apparatus 1100 for wireless power field testing of a base pad, in accordance with an exemplary implementation. As shown by FIG. 11, the apparatus 1100 may comprise a substantially circular sense loop 1101 and a location sensor 1120. The sense loop 1101 may be substantially the same as any one of the sense loops as previously described in connection with FIGS. 5-8. Since the sense loop 1101 may have a substantially circular cross section, the apparatus 1100 may be rotated in any direction perpendicular to the cross section of the sense loop 1101 without affecting the field measurement. Accordingly, the apparatus 1100 may have a single location sensor 1120, which may be configured to sense and/or measure a change in relative location of the apparatus 1100 during H-field measurement. In some implementations, the location sensor 1120 may comprise an optical sensor having operation similar to that of an optically tracked computer mouse. In some other implementations, the location sensor 1120 may comprise a mechanical location sensor (e.g., a rollerball as utilized in a computer mouse). However, any sensor type capable of delineating relative movement of the apparatus 1100 may alternatively be utilized. The apparatus 1100 may be a handheld apparatus that may be moved around a surface of a wireless power transmitter (see FIGS. 14A, 14B and 15) and may be configured to map the H-field (as sensed by the sense loop 1101) at each of a plurality of locations across the wireless power transmitter (as sensed by the location sensor 1120). The apparatus 1100 may be connected to a volt-meter and a display to allow a field plot to be filled in as the apparatus 1100 is moved across the surface of the wireless power transmitter. In some implementations, the apparatus 1100 may be connected to the separate display for guiding a user in scanning the surface of the wireless power transmitter. In some other implementations, a user of the apparatus 1100 may additionally utilize a printed, flexible guide that allows accurate placement and motion of the apparatus 1100. In yet some other implementations, a user of the apparatus 1100 may additionally utilize some other means for marking a surface of the wireless power transmitter resonator to guide the user in positioning the apparatus 1100.

Figure 12:
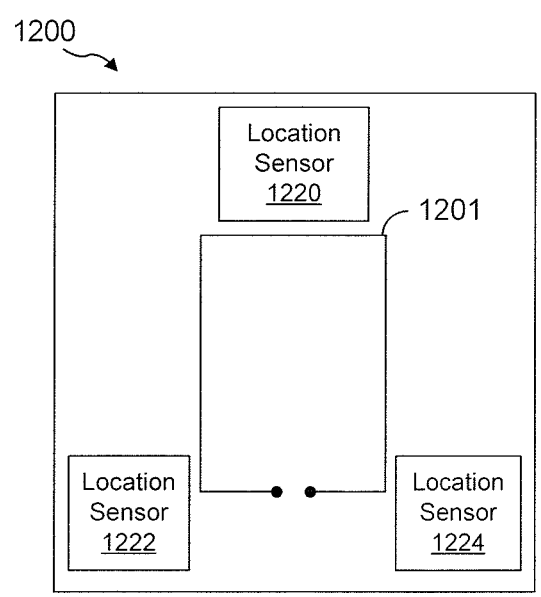
FIG. 12 is a diagram illustrating a bottom view of another apparatus for wireless power field testing of a base pad, in accordance with another exemplary implementation.

FIG. 12 is a diagram illustrating a bottom view of another apparatus 1200 for wireless power field testing of a base pad, in accordance with another exemplary implementation. As shown by FIG. 12, the apparatus 1200 may comprise a substantially rectangular sense loop 1201 and a plurality of location sensors 1220, 1222, 1224. The location sensors 1220, 1222, 1224 may be substantially the same as the location sensor 1120 of FIG. 11. The sense loop 1201 may be substantially the same as any one of the sense loops as previously described in connection with FIGS. 5-8. Since the sense loop 1201 has a substantially rectangular cross section, rotation of the apparatus 1200 in any direction perpendicular to the cross section of the sense loop 1201 may affect the field measurement. Accordingly, the apparatus 1200 may have the plurality of location sensors 1220, 1222, 1224, which may be configured to sense and/or measure a change in relative location, as well as rotation, of the apparatus 1200 during H-field measurement. The apparatus 1200 may be utilized by a user as previously described in connection with FIG. 11. A further advantage of the apparatus 1200 is that the "open" center may allow a line-of-sight viewing down the center of the apparatus 1200. This may allow a user to align the apparatus 1200 more accurately to marks on the surface of the wireless power transmitter even without feedback from the location sensors 1220, 1222, 1224. It may be desirable that both the apparatus 1100 of FIG. 11 and the apparatus 1200 of FIG. 12 utilize as little metal as possible in their construction, since metal will interfere with H-field measurements.

Figure 13:
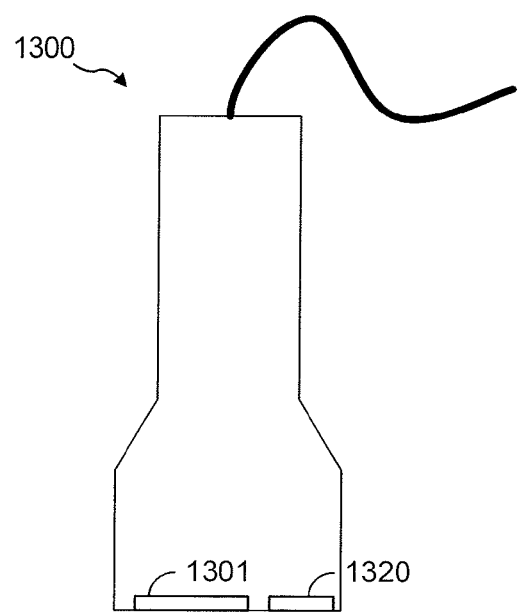
FIG. 13 is a diagram illustrating a side view of either of the apparatuses of FIGS. 11 and 12.

FIG. 13 is a diagram illustrating a side view 1300 of either of the apparatuses 1100/1200 of FIGS. 11 and 12. As shown in FIG. 13, the apparatus 1300 may include a sense loop 1301, which may correspond to either the sense loop 1101 of FIG. 11 or the sense loop 1201 of FIG. 12. The apparatus 1300 may additionally include one more location sensors 1320, which may correspond to either the location sensor 1120 of FIG. 11 or the plurality of location sensors 1220, 1222, 1224 of FIG. 12. Although particular positions of the sense loop 1301 and location sensor 1320 are shown, such positions are only exemplary and may be located at any position, according to a particular implementation.

Figure 14A:
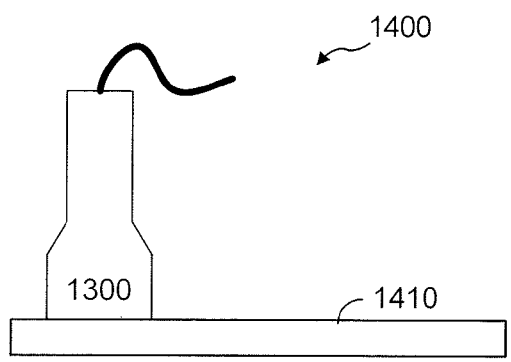
FIG. 14A is a diagram illustrating the apparatus of FIG. 13 for wireless power field testing of a substantially flat base pad, in accordance with an exemplary implementation.

FIG. 14A is a diagram 1400 illustrating the apparatus 1300 of FIG. 13 for wireless power field testing of a substantially flat base pad 1410, in accordance with an exemplary implementation. As shown in FIG. 14A, the apparatus 1300 may be moved across the surface of the base pad 1410. The user of the apparatus 1300 may align the apparatus 1300 to an explicit grid or to "field points" by eye, by utilizing positioning data provided by the one or more location sensors 1320, or in a free hand fashion as will be described in connection with FIG. 15.

Figure 14B:
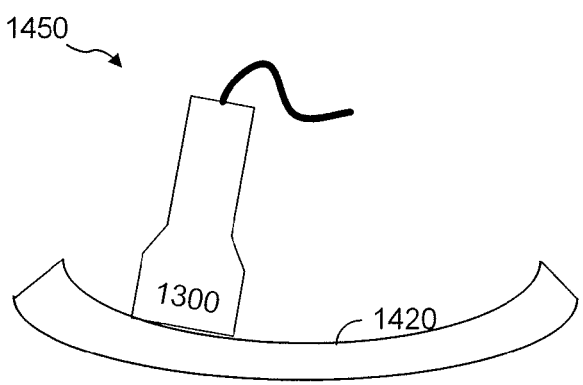
FIG. 14B is a diagram illustrating the apparatus of FIG. 13 for wireless power field testing of a substantially curved base pad, in accordance with an exemplary implementation.

FIG. 14B is a diagram 1450 illustrating the apparatus 1300 of FIG. 13 for wireless power field testing of a substantially curved base pad, in accordance with an exemplary implementation. As shown in FIG. 14B, the apparatus 1300 may be moved across the substantially curved surface of the base pad 1420. The user of the apparatus 1300 may align the apparatus 1300 to an explicit grid or "field points" by eye, by utilizing positioning data provided by the one or more location sensors 1320, or in a free hand fashion as will be described in connection with FIG. 15.

Figure 15:
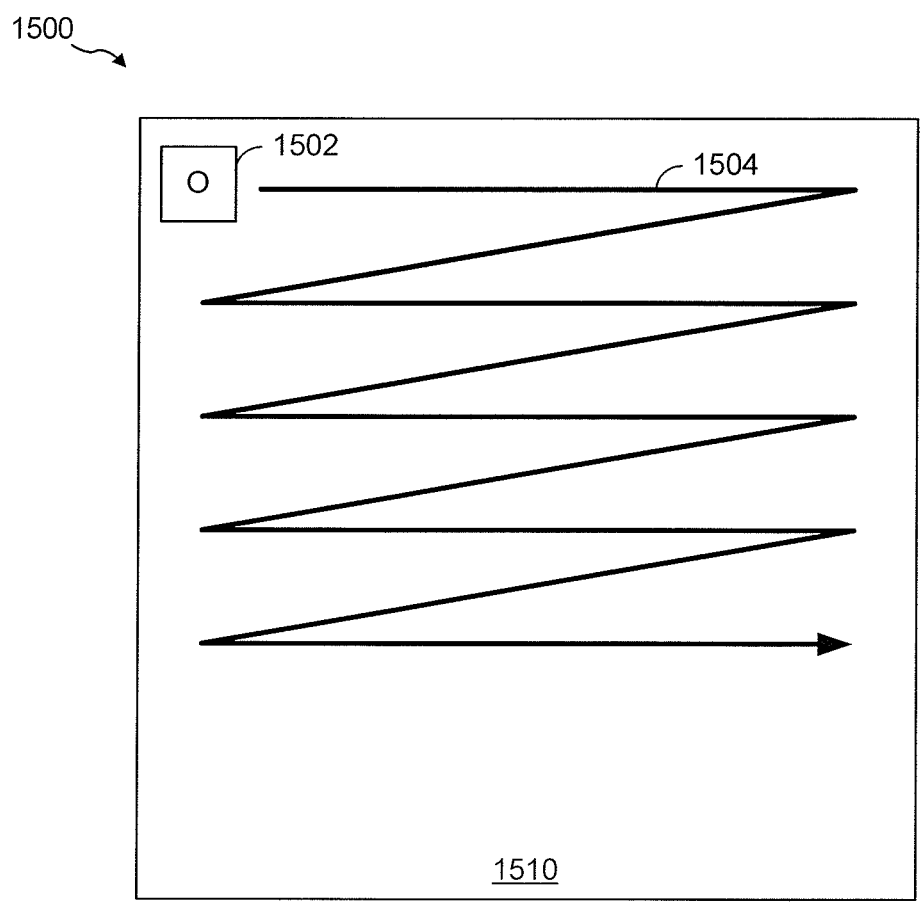
FIG. 15 is a diagram illustrating a scan pattern of the apparatus of FIG. 13 for wireless power field testing of a base pad, in accordance with an exemplary implementation.

FIG. 15 is a diagram 1500 illustrating a scan pattern 1504 of the apparatus 1300 of FIG. 13 for wireless power field testing of a base pad 1510, in accordance with an exemplary implementation. As shown in FIG. 15, the user may place the apparatus 1300 at an origin 1502 of a scanning pattern 1504, and then may move the apparatus 1300 across the surface of the base pad 1510 in the direction of the scanning pattern 1504 as shown. In some other implementations, the apparatus 1300 may be moved automatically by a machine configured to guide the apparatus 1300 across a predetermined area in a predetermined pattern. The sense loop 1301 (see FIG. 13) may sense and capture the H-field either continuously or periodically at each of a plurality of positions along the base pad 1510, as determined or sensed by the one or more location sensors 1320 (see FIG. 13). Where the H-field is not continuously monitored, the apparatus 1300 may be further configured to utilize mathematically simulation or analysis to interpolate H-field values at intermediate locations based on one more H-field measurements taken at one or more other proximate locations. Accordingly, a simple scanning pattern 1504 may be suitable to cover the entire surface of the base pad 1510. A display (not shown) may then show the user an H-field intensity plot being generated in real time. The real time display may also allow the user to identify regions missed during the scanning pattern 1504 and to go back to re-scan any such areas.

The various operations of methods described above may be performed by any suitable means capable of performing the operations, such as various hardware and/or software component(s), circuits, and/or module(s). Generally, any operations illustrated in the Figures may be performed by corresponding functional means capable of performing the operations.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative logical blocks, modules, circuits, and method steps described in connection with the implementations disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. The described functionality may be implemented in varying ways for each particular application, but such implementation decisions should not be interpreted as causing a departure from the scope of the implementations.

The various illustrative blocks, modules, and circuits described in connection with the implementations disclosed herein may be implemented or performed with a general purpose hardware processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose hardware processor may be a microprocessor, but in the alternative, the hardware processor may be any conventional processor, controller, microcontroller, or state machine. A hardware processor may also be implemented as a combination of computing devices, e.g., a combination of a DSP and a microprocessor, a plurality of microprocessors, one or more microprocessors in conjunction with a DSP core, or any other such configuration.

The steps of a method and functions described in connection with the implementations disclosed herein may be embodied directly in hardware, in a software module executed by a hardware processor, or in a combination of the two. If implemented in software, the functions may be stored on or transmitted as one or more instructions or code on a tangible, non-transitory computer readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art. A storage medium is coupled to the hardware processor such that the hardware processor can read information from, and write information to, the storage medium. In the alternative, the storage medium may be integral to the hardware processor. Disk and disc, as used herein, includes compact disc (CD), laser disc, optical disc, digital versatile disc (DVD), floppy disk and blu ray disc where disks usually reproduce data magnetically, while discs reproduce data optically with lasers. Combinations of the above should also be included within the scope of computer readable media. The hardware processor and the storage medium may reside in an ASIC.

For purposes of summarizing the disclosure, certain aspects, advantages and novel features s have been described herein. It is to be understood that not necessarily all such advantages may be achieved in accordance with any particular implementation. Thus, the invention may be embodied or carried out in a manner that achieves or optimizes one advantage or group of advantages as taught herein without necessarily achieving other advantages as may be taught or suggested herein.

Various modifications of the above described implementations will be readily apparent, and the generic principles defined herein may be applied to other implementations without departing from the spirit or scope of the application. Thus, the present application is not intended to be limited to the implementations shown herein but is to be accorded the widest scope consistent with the principles and novel features disclosed herein.

What is claimed is:

1. An apparatus for sensing magnetic field strength of a wireless charging pad, comprising:
   a plurality of conductive loops, each configured to sense a strength of a magnetic field passing through a respective loop of the plurality of conductive loops;
   at least one pair of terminals configured to be electrically connected to one or more of the plurality of conductive loops and configured to provide a voltage signal having a magnitude proportional to the strength of the magnetic field passing through the one or more of the plurality of conductive loops; and
   a processing circuit configured to:
      sum the voltage signal from, each of the plurality of conductive loops and
      determine a magnetic field strength of the magnetic field intersecting the plurality at least in part on thee signals.

2. The apparatus of claim 1, further comprising a multiplexer circuit configured to individually electrically connect each of at least a subset of the plurality of conductive loops to the at least one pair of terminals.

3. The apparatus of claim 2, wherein the multiplexer circuit is configured to sequentially provide the voltage signal having the magnitude proportional to the strength of the magnetic field passing through each of at least a subset of the plurality of conductive loops to the at least one pair of terminals.

4. The apparatus of claim 1, wherein the at least one pair of terminals comprises a plurality of pairs of terminals configured to simultaneously provide the voltage signal having the magnitude proportional to the strength of the magnetic field passing through each of at least a subset of the plurality of conductive loops.

5. The apparatus of claim 1, wherein the plurality of conductive loops are arranged in an array.

6. The apparatus of claim 1, wherein a first subset of the plurality of conductive loops overlaps a second subset of the plurality of conductive loops.

7. The apparatus of claim 1, wherein at least a first subset of the plurality of conductive loops have a different size than a second subset of the plurality of conductive loops.

8. The apparatus of claim 1, wherein each of the plurality of conductive loops are electrically isolated from each other loop of the plurality of conductive loops.

9. A method for sensing magnetic field strength of a wireless charging pad, comprising:
   sensing a voltage signal having a magnitude proportional to a strength of a magnetic field passing through each of at least a subset of a plurality of conductive loops;
   determining the strength of the magnetic field passing through each of at least the subset of the plurality of conductive loops based at least in part on the voltage signal;
   summing the voltage signal from each of at least the subset of the plurality of conductive loops; and
   determining a magnetic field strength of the magnetic field intersecting at least the subset of the plurality of conductive loops based at least in part on the summed voltage signals.

10. The method of claim 9, further comprising individually electrically connecting each of at least the subset of the plurality of conductive loops to at least one pair of terminals utilizing a multiplexing circuit.

11. The method of claim 9, wherein the sensing comprises sequentially sensing the voltage signal having the magnitude proportional to the strength of the magnetic field passing through each of at least the subset of the plurality of conductive loops.

12. The method of claim 9, wherein the sensing comprises simultaneously sensing the voltage signal having the magnitude proportional to the strength of the magnetic field passing through each of at least the subset of the plurality of conductive loops.

13. The method of claim 9, wherein the plurality of conductive loops are arranged in an array.

14. The method of claim 9, wherein a first subset of the plurality of conductive loops overlaps a second subset of the plurality of conductive loops.

15. The method of claim 9, wherein at least a first subset of the plurality of conductive loops have a different size than a second subset of the plurality of conductive loops.

16. The method of claim 9, wherein each of the plurality of conductive loops are electrically isolated from each other loop of the plurality of conductive loops.

17. An apparatus for sensing magnetic field strength of a wireless charging pad, comprising:
- a plurality of means for sensing a strength of a magnetic field passing through each of a plurality of predefined spatial areas;
- means for providing a voltage signal having a magnitude proportional to the strength of the magnetic field passing through one or more of the plurality of means for sensing, wherein the means for providing are configured to be electrically connected to one or more of the plurality of means for sensing;
- means for summing the voltage signal from each of the plurality of means for sensing; and
- means for generating a magnetic field strength of the magnetic field intersecting the plurality of means for sensing based at least in part on the summed voltage signals.

18. The apparatus of claim 17, further comprising means for individually electrically connecting each of at least a subset of the plurality of means for sensing to the means for providing the voltage.

19. The apparatus of claim 17, wherein the means for providing the voltage is configured to sequentially provide the voltage signal having the magnitude proportional to the strength of the magnetic field passing through each of at least a subset of the plurality of predefined spatial areas.

20. The apparatus of claim 17, wherein the means for providing the voltage comprises a plurality of pairs of terminals configured to simultaneously provide the voltage signal having the magnitude proportional to the strength of the magnetic field passing through each of at least a subset of the plurality of predefined areas.

* * * * *

UNITED STATES PATENT AND TRADEMARK OFFICE
CERTIFICATE OF CORRECTION

PATENT NO.         : 9,562,955 B2
APPLICATION NO.    : 14/493165
DATED              : February 7, 2017
INVENTOR(S)        : William H. Von Novak, III It is certified that error appears in the above-identified patent and that said Letters Patent is hereby corrected as shown below:

In the Drawings

Sheet 2 of 8 (FIG. 5) at Line 2 (approx.), Change "504" to --503--.

In the Specification

In Column 9 at Line 20, Change "a the" to --the--.

In Column 9 at Line 47, Change "and or" to --and/or--.

In the Claims

In Column 13 at Line 66, In Claim 1, change "from," to --from--.

In Column 13 at Line 67, In Claim 1, change "loops" to --loops,--.

In Column 14 at Line 2, In Claim 1, after "plurality" insert --of conductive loops based--.

In Column 14 at Line 2, In Claim 1, change "thee" to --the summed voltage--.

Signed and Sealed this
Sixth Day of June, 2017

Michelle K. Lee
*Director of the United States Patent and Trademark Office*